(12) United States Patent
Suzuki

(10) Patent No.: US 6,803,658 B2
(45) Date of Patent: Oct. 12, 2004

(54) SUBSTRATE WITH TOP-FLATTENED SOLDER BUMPS AND METHOD FOR MANUFACTURING THE SAME

(75) Inventor: Tomoe Suzuki, Aichi (JP)

(73) Assignee: NGK Spark Plug, Co., Ltd., Aichi-ken (JP)

(*) Notice: Subject to any disclaimer, the term of this patent is extended or adjusted under 35 U.S.C. 154(b) by 0 days.

(21) Appl. No.: 10/755,379

(22) Filed: Jan. 13, 2004

(65) Prior Publication Data

US 2004/0140561 A1 Jul. 22, 2004

Related U.S. Application Data

(62) Division of application No. 10/180,965, filed on Jun. 27, 2002, now Pat. No. 6,719,185.

(30) Foreign Application Priority Data

Jun. 27, 2001 (JP) .................................... 2001-194772

(51) Int. Cl.⁷ .............................. H01L 23/48; H05K 1/03
(52) U.S. Cl. ....................... 257/737; 257/686; 257/734; 257/738; 174/255; 174/256
(58) Field of Search ............................. 257/686, 734, 257/737, 738; 174/255, 256, 262

(56) References Cited

U.S. PATENT DOCUMENTS 6,613,986 B1 * 9/2003 Hirose et al. ............... 174/255
2003/0102547 A1 * 6/2003 Higashi et al. ............. 257/686

* cited by examiner

Primary Examiner—David Nelms
Assistant Examiner—Long Tran
(74) Attorney, Agent, or Firm—Stites & Harbison PLLC; Ross F. Hunt, Jr.

(57) ABSTRACT

A wiring substrate includes a solid layer formed on the core substrate to partially cover the same. At least one resin dielectric layer is formed on the solid layer and the core substrate while a plurality of pads are formed on the resin dielectric layer and are exposed at the main surface of the wiring substrate. First pads are located within a region above the solid layer and second pads located outside of that region. First top-flattened solder bumps are formed on the first pads and second top-flattened solder bumps are formed on the second pads. The bumps all include a top face of the same diameter.

2 Claims, 6 Drawing Sheets

SUBSTRATE WITH TOP-FLATTENED SOLDER BUMPS AND METHOD FOR MANUFACTURING THE SAME

CROSS REFERENCE TO RELATED APPLICATIONS

This application is a divisional of U.S. Ser. No. 10/180,965 filed on Jun. 27, 2002, U.S Pat. No. 6,719,185.

BACKGROUND OF THE INVENTION

1. Field of the Invention

The present invention relates to a wiring substrate having top-flattened solder bumps projecting from the main surface thereof, and to a method for manufacturing the same.

2. Description of the Related Art

A known wiring substrate includes a resin dielectric layer and a conductor layer formed in a predetermined pattern on the resin dielectric layer. An example of such a wiring substrate is shown in FIG. 5, which is an enlarged partially broken away, sectional view of a substrate 101 and which shows a portion located on the side toward the main surface. The substrate 101 has a core substrate (resin dielectric layer) 103 at its center. One or more resin dielectric layers 105 are formed in layers on either side of the core substrate 103, and a solder resist layer (resin dielectric layer) 107 is formed on the dielectric layer 105 on one side of the core substrate 103, thereby providing the main surface of the substrate 101.

A plurality of substantially cylindrical through-hole conductors 111 are formed in the core substrate 103 at predetermined positions and are filled with respective resin fillers 112. A plurality of through-holes 113 which enable the formation of vias are formed in the resin dielectric layer 105 at predetermined positions, and via conductors 115 are formed in the corresponding through-holes 113. A plurality of openings 117 which provide exposure of respective pads 116 are formed in the solder resist layer 107 at predetermined positions. Further, a first conductor layer 118 including wiring lines and pads is formed in a predetermined pattern between the core substrate 103 and the resin dielectric layer 105 and is connected to the through-hole conductors 111 formed in the core substrate 103 and the via conductors 115 formed in the resin dielectric layer 105. In addition, a second conductor layer 119 including wiring lines and pads is formed in a predetermined pattern between the resin dielectric layer 105 and the solder resist layer 107 and is connected to the via conductors 115. When a plurality of the resin dielectric layers 105 are formed, a conductor layer (not shown) is provided between the resin dielectric layers corresponding to layer 105.

In the substrate 101, bumps are formed of, for example, solder or gold on the corresponding pads 116 formed in the solder resist layer 107, so as to serve as terminals for electrical connection. Further, in order to ensure connection to an electronic component (e.g., an IC chip, a chip capacitor, a chip resistor, or the like) to be mounted on the substrate 101, the bumps are flattened at their tops by use of a flat pressing surface, thereby forming top-flattened solder bumps corresponding to bump 120.

Because the substrate 101 uses a resin layer of substantially uniform thickness as the resin dielectric layer 105, portions of the resin dielectric layer 105 located above the first conductor layer 118 present between the core substrate 103 and the resin dielectric layer 105 rise slightly. In the course of forming the resin dielectric layer 105, the resin dielectric layer 105 is pressed while being heated, and thus the surface of the resin dielectric layer 105 is flattened to a certain extent. However, for example, as shown in FIG. 6, a portion of the resin dielectric layer 105 which is formed on a solid layer 121 (which is a portion of the first conductor layer 118 and extends over a certain area) unavoidably rises to a certain extent in relation to the remaining portion of the resin dielectric layer 105. As a result, a first pad 116B, which is located within a region which is formed by projecting the solid layer 121 toward the main surface (hereinafter simply referred to as a "region above the solid layer") is formed at a raised position whereas a second pad 116C is located outside the region above the solid layer. Thus, as represented by dotted lines in FIG. 6, the solder bump 122B formed on the first pad 116B and the solder bump 122C formed on the second pad 116C are of the same size, but differ slightly in the position of the vertex, i.e., bump 122B projects outwardly from substrate 101 slightly more than bump 122C. These solder bumps 122B and 122C are flattened at their tops through pressing, through the use of a common, flat pressing surface 123, and are thus formed into a first top-flattened solder bump 120B and a second top-flattened solder bump 120C, respectively. Since the difference in the positions of the vertices of the bumps 122B and 122C results in a difference in the amount of solder to be crushed in the course of the flattening process, the diameter M1 of the top face of the top-flattened solder bump 120B is greater than the diameter M2 of the top face of the top-flattened solder bump 120C, as shown in FIG. 6. Actual measurements have revealed that a difference of 2 to 3 $\mu$m in positional height between the pads 116 leads to a difference of about 10 $\mu$m in top face diameter between the top-flattened solder bumps 120.

It will be appreciated that the connection terminals of an electronic component to be mounted on the substrate 101 are formed in a very uniform fashion, and that the fact that the top-flattened solder bumps 120 of the substrate 101 differ in top face diameter can, in some cases, result in variations in connection accuracy among the connections when the electronic component is mounted on the substrate 101.

SUMMARY OF THE INVENTION

An object of the invention is to provide an improved wiring substrate in which top-flattened solder bumps have substantially the same top face diameter irrespective of the presence of a solid layer, and to thereby improve the accuracy of the connections between the wiring substrate and an electronic component mounted thereon.

Another object of the present invention is to provide a method for manufacturing the improved wiring substrate.

According to one aspect of the invention, in order to achieve the above objects, the present invention provides a method for manufacturing a wiring substrate having a main surface, a back surface, and a plurality of top-flattened solder bumps projecting from the main surface. The method comprises the steps of: forming a solid layer on a core substrate so as to partially cover the core substrate; forming at least one resin dielectric layer on the solid layer and the core substrate; forming a plurality of pads on the resin dielectric layer in such a manner that the plurality of pads are exposed at the main surface of the wiring substrate, the pads including first pads located within a region above the solid layer and second pads located outside of the region; applying, through printing, solder paste onto the plurality of pads such that the amount of solder paste applied onto each of the first pads is smaller than that applied onto each of the second pads; melting the applied solder paste, through reflowing, so as to form substantially hemispherical solder bumps; and flattening top portions of the substantially hemispherical solder bumps through pressing of a flat pressing surface against the top portions, thereby forming the top-flattened solder bumps.

According to an important feature of the present invention, solder paste is applied through printing onto a plurality of pads which are exposed at the main surface so that the solder paste can be applied thereto. Next, the applied solder paste is melted to obtain the substantially hemispherical solder bumps. Subsequently, the aforementioned flat pressing surface is pressed against top portions of the solder bumps so as to obtain the top-flattened solder bumps. Relative to the solder paste application step, each pad is classified as first pad or second pad in accordance with whether or not the pad is located within the region above the solid layer and, as indicated above, a pad is classified as first pad when the pad is located within the region above the solid layer, and as a second pad when the pad is located outside the region. A key feature is that the amount of solder paste applied onto the first pads is smaller than that of solder paste applied onto the second pads.

Generally, the overall thickness of a wiring substrate increases at a portion where a solid layer is sandwiched between layers, as compared with a portion where such a solid layer is absent. As a result, when solder bumps are to be top-flattened by use of a common flat pressing surface, the distance (vertical spacing) between the first pads and the flat pressing surface is shorter or smaller than that between the second pads and the flat pressing surface. In other words, after the flattening step, in terms of the height of a given solder bump above a corresponding pad, the solder bumps formed on the corresponding first pads are lower or shorter than those formed on the second pads. As a consequence, when solder paste is applied in the same amount onto both the first and second pads, because the solder bumps formed on the corresponding first pads are pressed downward to a greater extent than, and thus are shorter than, those formed on the second pads, the solder bumps formed on the first pads have a top face greater in diameter than the top face of the solder bumps formed on the second pads.

In contrast, according to the present invention, since the amount of the solder paste applied to each of the first pads is smaller than that of the solder paste applied onto each of the second pads, the solder bumps formed on the corresponding first pads are smaller in size than those formed on the second pads, thereby reducing the difference in top face diameter between first top-flattened solder bumps formed on the corresponding first pads and second top-flattened solder bumps formed on the corresponding second pads. Therefore, when an electronic component is mounted on a wiring substrate according to the present invention, the connection terminals of the electronic component are connected to the first pads and the second pads under similar conditions, irrespective of presence of the solid layer.

The aforementioned resin dielectric layer may be formed of any resin so long as the resin has substrate insulating properties. Examples of such a resin include an epoxy resin, a BT resin, and a composite material formed from resin, and glass fiber or ceramic powder, such as a glass-epoxy composite material. The solid layer is a conductor layer provided between resin dielectric layers while extending over a certain area. The metal used to form the solder bumps may be selected as appropriate in accordance with, for example, the material for the connection terminals of an electronic component to be mounted on the wiring substrate. Examples of such a metal include a Pb—Sn solder such as 90Pb-10Sn, 95Pb-5Sn, and 40Pb-60Sn; a Sn—Sb solder; a Sn—Ag solder; a Sn—Ag—Cu solder; an Au—Ge solder; and an Au—Sn solder. The flat pressing surface is preferably formed by use of a metallic material such as steel, or a ceramic material.

Each pad can be implemented in various forms including, for example, a pad-on-via (wherein a pad is provided on a via), or a pad-off-via (wherein a pad is provided off a via). Pads of different forms may be present on the same wiring substrate. Each via may assume the form of a filled via, which is filled with plating metal and has a flat top face, or an unfilled via, which is not completely filled with plating metal and is depressed at a central portion thereof.

The amount of solder paste to be applied onto a particular pad must be determined in consideration of the form of each pad and that of each via. For example, in the case of a pad associated with an unfilled via, the amount of solder paste depends on whether the pad is a pad-on-via or a pad-off-via. Certain wiring substrates may include pads of different areas (because of, e.g., openings of different diameters for exposure of the pads). Therefore, when the same wiring substrate includes pads of different forms or different sizes, the present invention must be applied to first and second pads of the same form and the same size, i.e., to first pads and to those second pads which are identical with the first pads in terms of form and size.

Preferably, the flattening step is adapted to form the top-flattened solder bumps such that the diameter of a top face of each of the first top-flattened solder bumps formed on the corresponding first pads is substantially equal to that of a top face of each of the second top-flattened solder bumps formed on the corresponding second pads.

According to the present invention, in the flattening step, the solder bumps are top-flattened such that the diameter of the top face of each first top-flattened solder bump formed on the corresponding first pad is substantially equal to that of the top face of each second top-flattened solder bump formed on the corresponding second pad. Therefore, in a subsequent step of mounting an electronic component on the wiring substrate, the first pads and the second pads are able to effect substantially the same state of connection to the connection terminals of the electronic component.

Preferably, a printing mask is used in the solder paste application step and has first through-holes corresponding to the first pads, and second through-holes corresponding to the second pads, the first and second through-holes being formed such that the diameter of the first through-holes is smaller than that of the second through-holes.

According to this aspect of the present invention, wherein the solder paste application step uses a printing mask having through-holes formed therein such that the diameter of through-holes corresponding to the first pads is smaller than that of through-holes corresponding to the second pads, even when solder paste is applied onto the first and second pads in a similar manner, the amount of solder paste to be applied onto each first pad through the printing mask is smaller than the amount of solder paste to be applied onto each second pad through the printing mask. Therefore, by virtue of the consequent reduction in the difference in top face diameter between top-flattened solder bumps that results from the presence or absence of a solid layer, there can be realized a reduction in the difference in quality of the connection between top-flattened solder bumps formed on the first pads and those formed on the second pads.

If top-flattened solder bumps can be provided which have substantially the same top face diameter, regardless of the presence/absence of a solid layer, in a subsequent step of mounting an electronic component on the wiring substrate of the invention, the first pads and the second pads can realize or achieve substantially the same state of connection to the connection terminals of the electronic component.

No particular limitation is imposed on the printing mask, so long as the printing mask has through-holes formed therein so as to allow solder paste to pass therethrough. Examples of such a printing mask include a screen mask, and a metal mask, i.e., a metal sheet, such as a stainless steel sheet, having holes formed therein.

In accordance with a further aspect of the present invention a wiring substrate is provided having a main surface, a back surface, and a plurality of top-flattened solder bumps projecting from the main surface, the wiring substrate comprising a core substrate; a solid layer formed on the core substrate and partially covering the core substrate; at least one resin dielectric layer formed on the solid layer and the core substrate; a plurality of pads formed on the resin dielectric layer and exposed from the main surface, the pads including first pads located within a region above the solid layer and second pads located outside of the region; and first top-flattened solder bumps formed on the corresponding first pads and second top-flattened solder bumps formed on the corresponding second pads. The diameter of a top face of each of the first top-flattened solder bumps is substantially equal to that of a top face of each of the second top-flattened solder bumps.

The wiring substrate of the present invention is configured such that solder bumps formed on the corresponding pads on the main surface assume substantially the same top face diameter irrespective of presence of the solid layer. Therefore, in a subsequent step in the manufacture of the wiring substrate in accordance with this aspect of the invention wherein an electronic component is mounted on the wiring substrate, the first pads and the second pads can achieve or realize substantially the same state of connection to the connection terminals of the electronic component.

Further features and advantages of the present invention will be set forth in, or apparent from, the detailed description of preferred embodiments thereof which follows.

DESCRIPTION OF THE PREFERRED EMBODIMENTS

One preferred embodiment of the present invention will next be described in detail with reference to the drawings.

Figure 1:
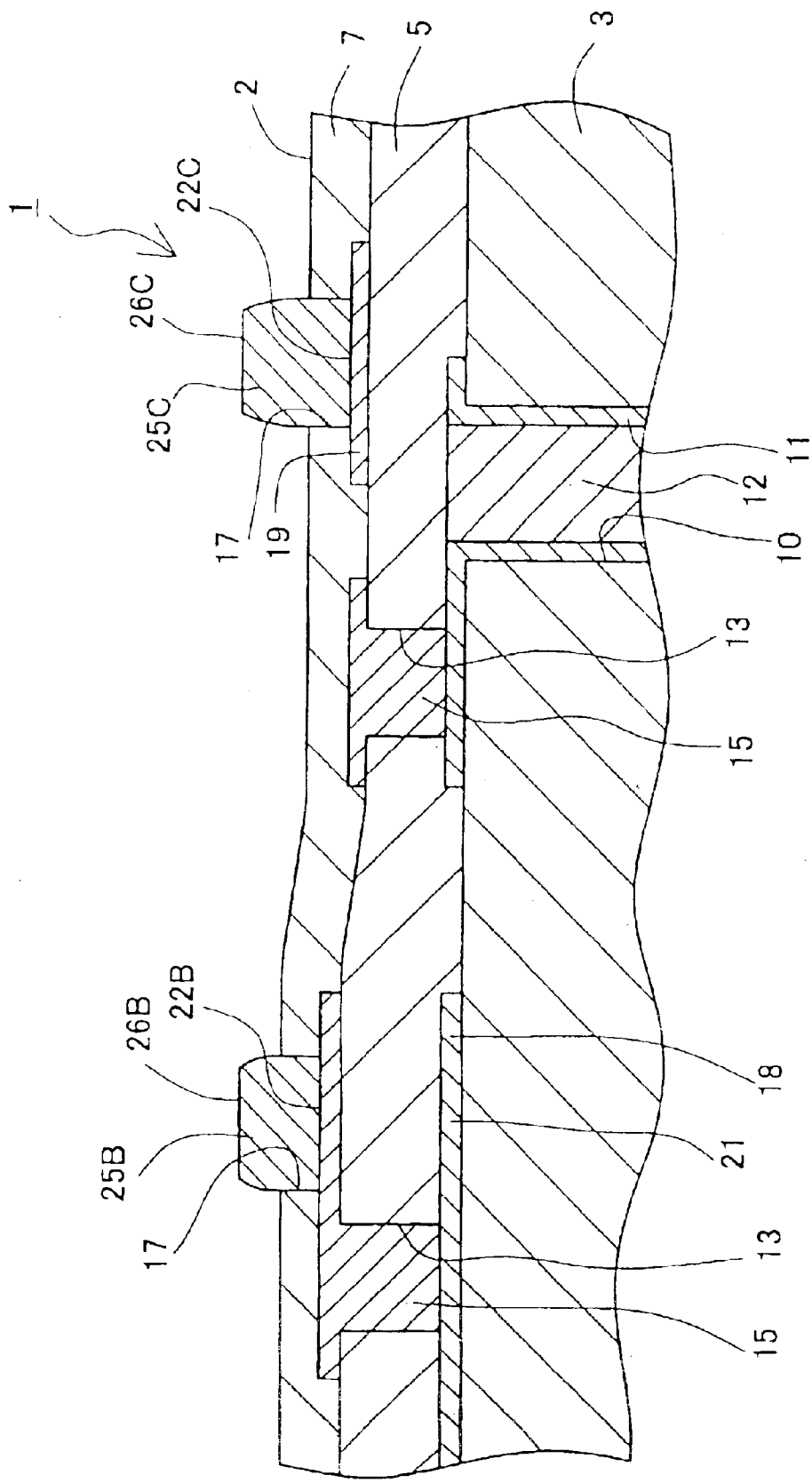
FIG. 1 is an enlarged, partially broken away, cross sectional view of a substrate according to one embodiment of the present invention.

FIG. 1 is an enlarged partially broken away, sectional view of a substrate 1 according to a preferred embodiment of the present invention, showing a portion located on the side toward the main surface. The substrate 1 has a main surface 2 and an unillustrated back surface, and is of a substantially rectangular, substantially platelike or planar shape. The substrate 1 includes, at its center, a substantially platelike core substrate (resin dielectric layer) 3, which is advantageously formed of a composite material of glass fiber cloth impregnated with epoxy resin and in an exemplary implementation has a thickness of about 600 $\mu$m. A resin dielectric layer 5 formed of, for example, epoxy resin and having a preferred thickness of about 30 $\mu$m overlies each side of the core substrate 3. A solder resist layer (resin dielectric layer) 7 formed of, for example, epoxy resin and having a preferred thickness of about 25 $\mu$m overlies the resin dielectric layer 5.

The core substrate 3 has a plurality of through-holes 10 each having a preferred diameter of about 250 $\mu$m formed therein at predetermined positions so as to allow formation of through-hole conductors. A cylindrical through-hole conductor 11 is formed on the inner circumferential surface of each through-hole 10. Each of the through-hole conductors 11 is filled with a substantially columnar filler material 12 formed of, for example, epoxy resin. The resin dielectric layer 5 has a plurality of through-holes 13 formed therein at predetermined positions so as to allow formation of vias. A substantially columnar via conductor 15 is formed in each of the through-holes 13. The solder resist layer 7 has a plurality of openings 17 each having a preferred diameter of about 120 $\mu$m formed therein at predetermined positions in such a manner as to extend through the same, so as to provide exposure of pads.

A first conductor layer 18, which includes a solid layer 21 extending over a certain area, is formed between the core substrate 3 and the resin dielectric layer 5, and is connected to the through-hole conductors 11 formed in the core substrate 3 and to the via conductors 15 formed in the resin dielectric layer 5. A second conductor layer 19 including wiring lines and pads is formed in a predetermined pattern between the resin dielectric layer 5 and the solder resist layer 7, and is connected to the via conductors 15 formed in the resin dielectric layer 5.

As shown in FIG. 1, a portion of the resin dielectric layer 5 which overlies the solid layer 21 has a thickness substantially equal to that of a portion of the resin dielectric layer 5 in direct contact with the core substrate 3. Therefore, the height of the upper surface of the resin dielectric layer 5 above the core substrate 3 as measured within the region above the solid layer 21 is greater than that measured outside the region.

Parts of pads 22B and 22C (collectively referred to as pads 22) formed between the resin dielectric layer 5 and the solder resist layer 7 are exposed through the openings 17 formed in the solder resist layer 7, so as to enable mounting an electronic component such an IC chip on the substrate 1. A nickel plating layer (not shown) is formed on the surface of each of these pads 22 in order to prevent oxidation, and a gold plating layer (not shown) is formed on the surface of the nickel plating layer. Since the upper surface of the resin dielectric layer 5 is raised within the region above the solid layer 21, a first pad 22B formed within the region is located at a height above the core substrate 3 greater than that at which a second pad 22C formed outside the region is located. It will be appreciated that while only a single pad 22B and a single pad 22C are shown, the substrate 1 includes a plurality of these pads and thus the pads will be referred to in the plural.

Solder bumps are formed on a plurality of pads 22 and project from the main surface 2 of the substrate, such that first top-flattened solder bumps 25B are formed on the corresponding first pads 22B, and second top-flattened solder bumps 25C are formed on the corresponding second pads 22C. The top-flattened solder bumps 25B and 25C are preferably formed of 40Pb-60Sn solder, and each covers the entire surface of each of the pads 22B and 22C. The first top-flattened solder bumps 25B are lower in height and smaller in volume than the second top-flattened solder bumps 25C, and project from the main surface 2 a smaller amount than do the second top-flattened solder bumps 25C. However, since the height above the core substrate 3 of the first pads 22B is greater than that of the second pads 22C, the top faces 26B of the first top-flattened solder bumps 25B and the top faces 26C of the second top-flattened solder bumps 25C lie in substantially the same plane. The top faces 26B and 26C are flat and have a diameter of about 105 μm.

The substrate 1 is manufactured in the following manner.

Figure 2:
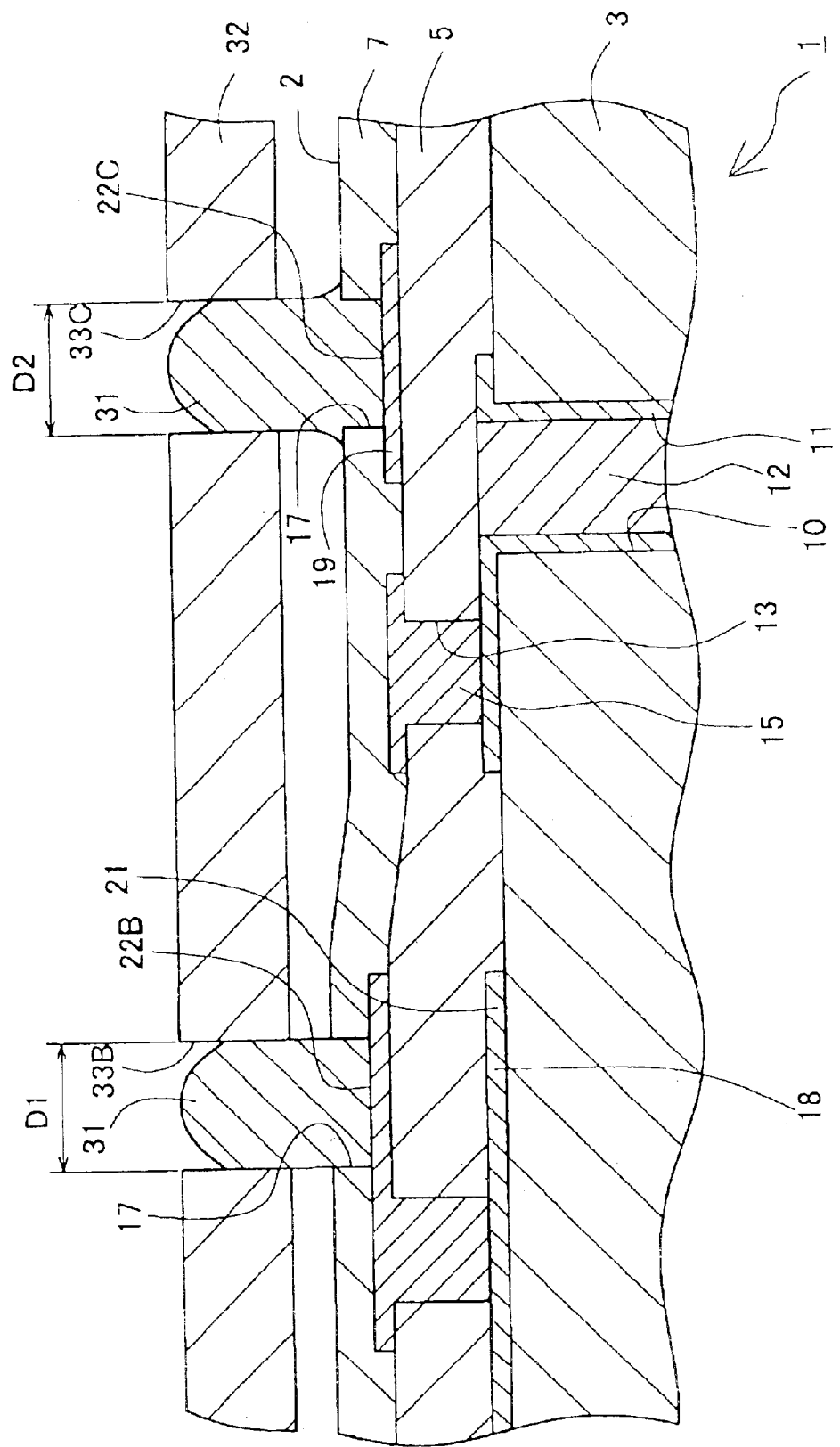
FIG. 2 is a view similar to FIG. 1 showing a state in which solder paste has been applied onto corresponding pads.

Referring to FIG. 2, by use of known processes, the through-hole conductors 11 are formed in the core substrate 3, the first conductor layer 18 including the solid layer 21 is formed in a predetermined pattern on the core substrate 3, and the through-hole conductors 11 are filled with the resin filler material 12. Next, the resin dielectric layer 5 is placed on the core substrate 3 and on the first conductor layer 18, and a copper foil, preferably having a thickness of about 5 μm, is placed on the resin dielectric layer 5. The resultant assembly is pressed while being heated, thereby forming the copper-clad resin dielectric layer 5 on the core substrate 3 and on the first conductor layer 18. A plurality of through-holes 13 used in the formation of vias are formed in the copper-clad resin dielectric layer 5 at predetermined positions by use of, for example, laser beam.

Next, also by use of known processes, the substantially columnar via conductors 15 are formed in the corresponding through-holes 13, and the second conductor layer 19 is formed in a predetermined pattern on the resin dielectric layer 5. Then, the solder resist layer 7 is formed on the resin dielectric layer 5 and on the second conductor layer 19 such that the openings 17 are formed therein so as to provide exposure of pads. Subsequently, a nickel plating layer (not shown) is formed on the pads 22 exposed through the openings 17 formed in the solder resist layer 7, in order to prevent oxidation, and a gold plating layer (not shown) is formed on the nickel plating layer.

Next, in the solder paste application step, a (e.g., 40Pb-60Sn) solder paste 31 is applied onto the pads 22 (see FIG. 2). Specifically, a printing mask 32 is placed on the substrate 1, and then the solder paste 31 is applied onto the printing mask 32 by use of a squeegee (not shown). The solder paste 31 passes through through-holes 33 formed in the printing mask 32 and adheres to the pads 22. The printing mask 32 is formed of a stainless sheet into a substantially rectangular shape similar to that for the substrate 1, and has the through-holes 33 formed therein at positions corresponding to the positions of the pads 22.

The diameter D1 of first through-holes 33B corresponding to the first pads 22B, which are formed within the region above the solid layer 21, is smaller than the diameter D2 of second through-holes 33C corresponding to the second pads 22C, which are formed outside the region. In an exemplary embodiment, the diameter D1 of the first through-holes 33B is about 130 μm, and the diameter D2 of the second through-holes 33C is about 150 μm. As a result, the amount of the solder paste 31 to be applied to each first pad 22B is smaller than that of the solder paste 31 to be applied to each second pad 22C.

Figure 3:
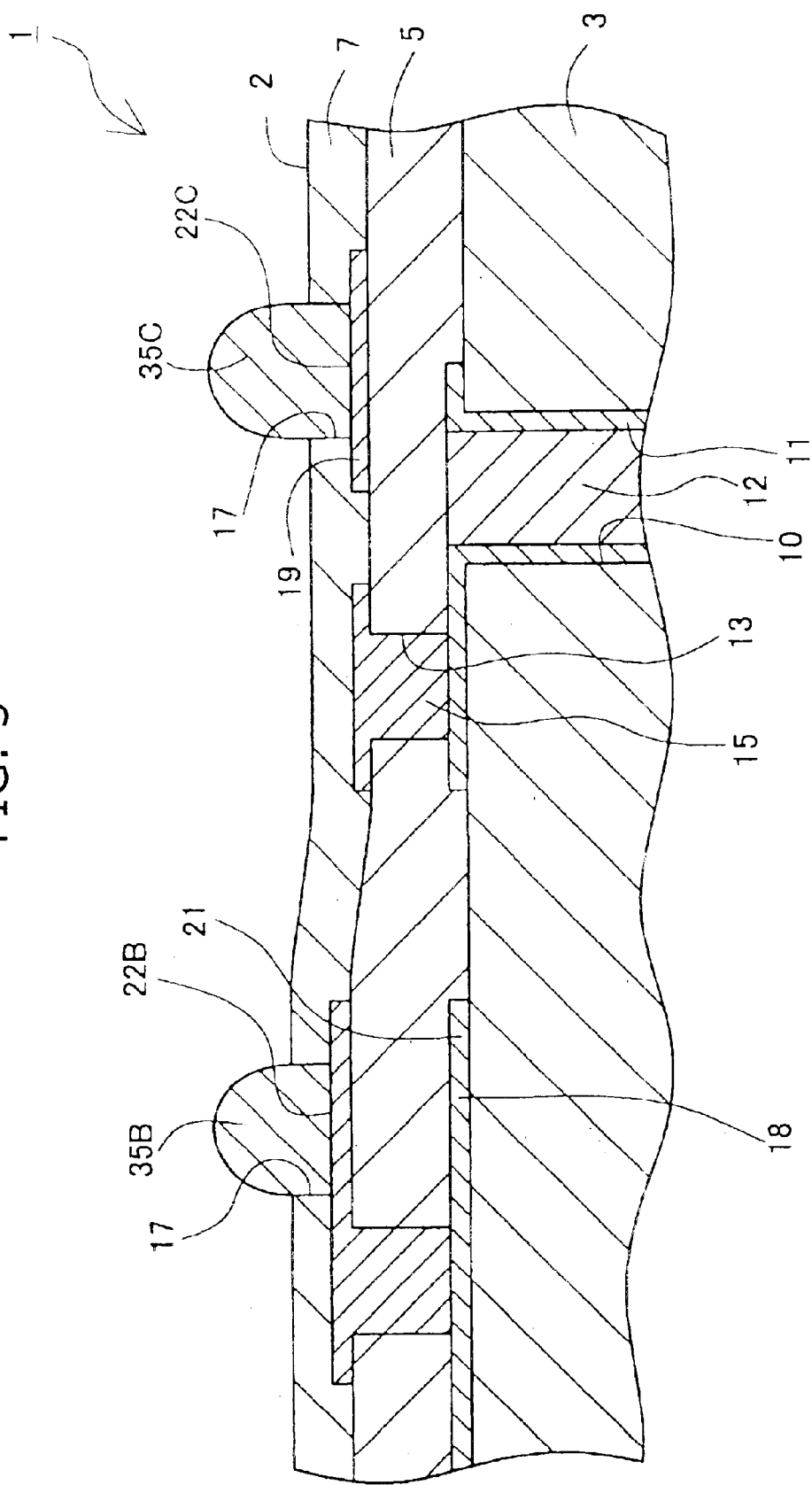
FIG. 3 is a view showing a state in which solder bumps have been formed on the pads.

Next, in a reflow step, the applied solder paste 31 is melted, thereby forming substantially hemispherical solder bumps 35 (see FIG. 3). When the solder paste 31 is melted, the molten solder paste 31 assumes a substantially hemispherical shape because of surface tension, thereby resulting in the substantially hemispherical solder bumps 35. Since the amount of solder paste 31 applied to each of the first pads 22B is smaller than that of the solder paste applied to each of the second pads 22C, as shown in FIG. 3, the first solder bumps 35B formed on the corresponding first pads 22B are smaller in volume than the second solder bumps 35C formed on the corresponding second pads 22C, and the height of the first solder bumps 35B above the first pads 22B is lower than that of the second solder bumps 35C above the second pads 22C.

Figure 4:
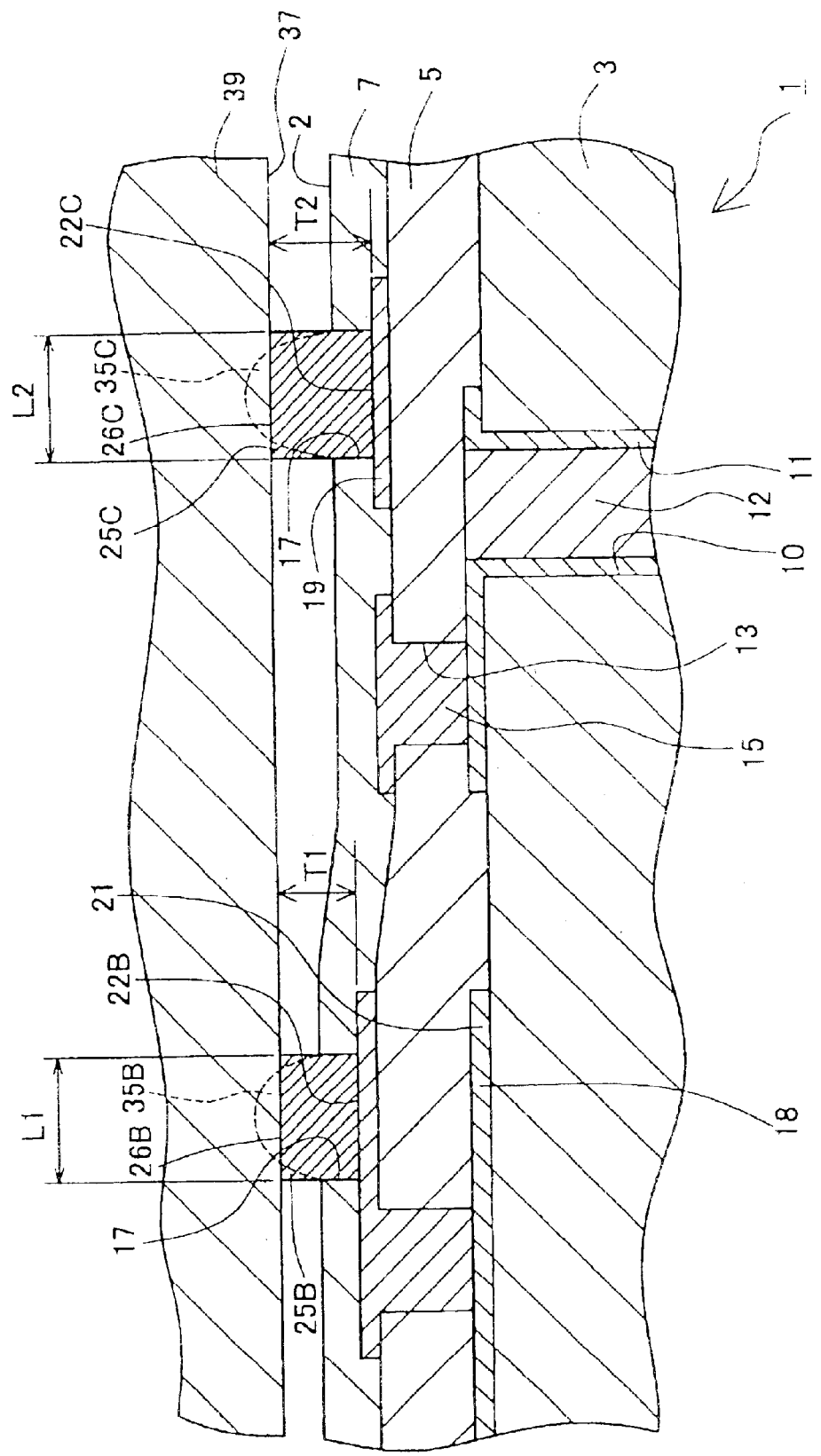
FIG. 4 is an explanatory view showing a state in which the solder bumps have been pressed to form top-flattening solder bumps.
Figure 5:
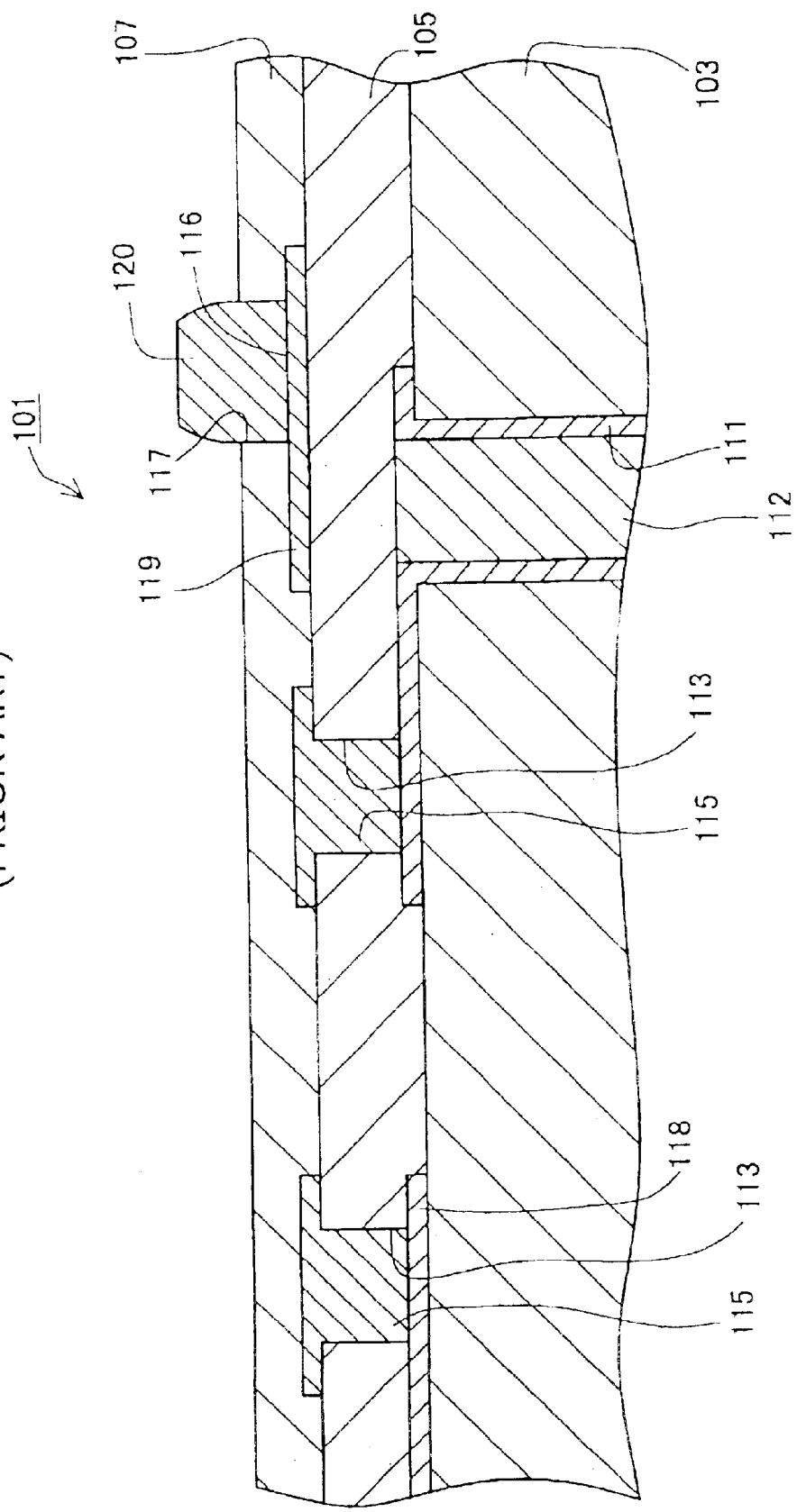
FIG. 5 is an enlarged partial, sectional view of a conventional substrate.
Figure 6:
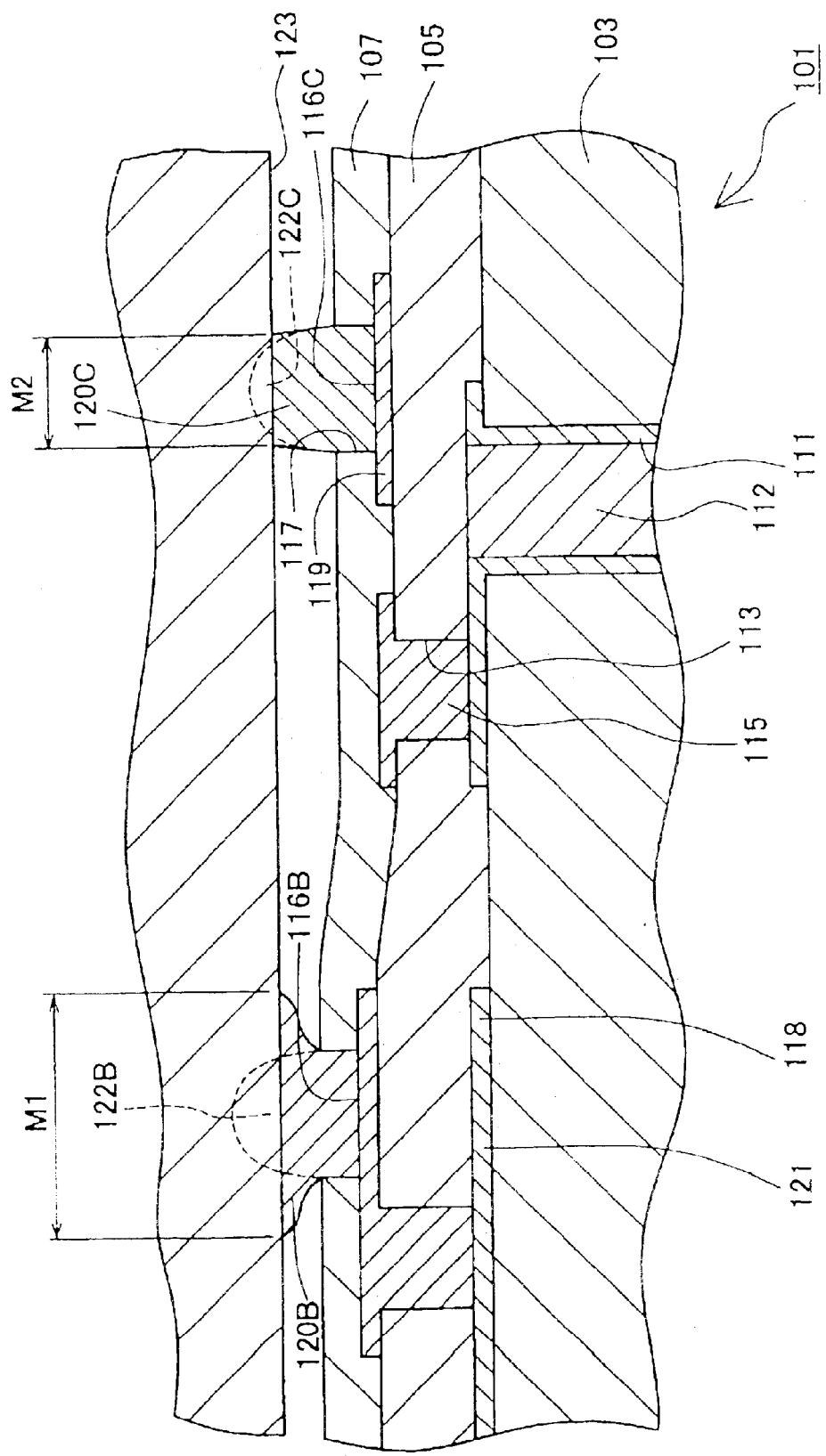
FIG. 6 is another enlarged partial, sectional view of the conventional substrate.

Next, in the flattening step, the solder bumps 35 are top-flattened by pressing a flat pressing surface 37 of a presser tool 39 against top portions thereof, thereby forming top-flattened solder bumps 25 (see FIG. 4). For example, through the use of a flattening apparatus utilizing an air press (not shown) for pressing the flat pressing surface 37 against the solder bumps 35 of the substrate 1, the solder bumps 35 are top-flattened at a pressing force of about 75 kg to 100 kg. At this time, the pressing surface 37 may be heated so as to facilitate deformation of the solder bumps 35 through application of heat in the course of the pressing operation.

As shown in FIG. 4, since the solid layer 21 is present underneath, in the pressure applied state, the distance T1 between the pressing surface 37 and the first pads 22B becomes less than the distance T2 between the pressing surface 37 and the second pads 22C. However, since the first solder bumps 35B formed on the corresponding first pads 22B are smaller in volume than the second solder bumps 35C formed on the corresponding second pads 22C, and the height of the first solder bumps 35B above the first pads 22B is lower than that of the second solder bumps 35C above the second pads 22C, there is a reduction in the difference in the amount of solder to be crushed or flattened by the pressing surface 37 between the first solder bumps 35B and the second solder bumps 35C. Therefore, there is a reduction in the difference between the diameter L1 of the top faces 26B of the first top-flattened solder bumps 25B formed from the first solder bumps 35B and the diameter L2 of the top faces 26C of the second top-flattened solder bumps 25C formed from the second solder bumps 35C.

It is noted that through appropriate adjustment of the diameters of the first and second through-holes 33B and 33C formed in the printing mask 32, the diameter L1 of the top faces 26B of the first top-flattened solder bumps 25B and the diameter L2 of the top faces 26C of the second top-flattened solder bumps 25C can have substantially the same value.

Thus is completed the substrate 1.

The diameters of the top faces 26 of the top-flattened solder bumps 25 formed on the substrate 1 were measured, and the following diameter-related data were obtained from measured values of diameter: average 105.4 μm; maximum 133.9 μm; minimum 74.4 μm; range 59.5 μm; and standard deviation 8.1. In the case of the conventional substrate 101, the following diameter-related data were obtained: average 118.9 μm; maximum 182.9 μm; minimum 62.9 m; range 120.0 μm; and standard deviation 10.4. As is apparent from the data, the present invention provides an improvement in terms of range and standard deviation.

While the present invention has been described with reference to a presently preferred embodiment, the present invention is not limited thereto, but may be modified as appropriate without departing from the spirit or scope of the invention.

For example, the above embodiment is described in reference to the via conductors 15 of the filled via type formed in the through-holes 13. However, bowl-shaped (unfilled via type) via conductors, whose central portion is depressed, may also be employed. In this case, pads of the same type (pad-on-via type or pad-off-via type) are classified into the first pads 22B and the second pads 22C in accordance with the presence/absence of a solid layer.

According to the above-described embodiment, in classification of each pad 22 as either a first pad 22B or a second pad 22C, the sole factor considered is whether or not the pad 22 is located within the region above the solid layer 21. However, for example, each pad 22 can also be classified in accordance with whether or not an end portion of the solid layer 21, a wiring line, or a like element is present under the pad 22. In this case, the diameter of the through-holes 33 formed in the printing mask 32 may be modified according to individual classification conditions of the pads 22, so that the top faces 26 of the top-flattened solder bumps 25 can assume higher uniformity in terms of diameter.

It is also noted that the above embodiment has been described in reference to the substrate 1 which is configured such that a single resin dielectric layer 5 is sandwiched between the core substrate 3 and the solder resist layer 7. However, a plurality of resin dielectric layers 5 may be formed between the core substrate 3 and the solder resist layer 7. In this regard, the present invention is applicable even when the solid layer 21 is formed between the resin dielectric layers 5 instead of being formed between the core substrate 3 and the resin dielectric layer 5.

Although the invention has been described above in relation to preferred embodiments thereof, it will be understood by those skilled in the art that variations and modifications can be effected in these preferred embodiments without departing from the scope and spirit of the invention.

What is claimed:

1. A wiring substrate having a main surface, a back surface, and a plurality of top-flattened solder bumps projecting from the main surface, said substrate comprising:

a core substrate;

a solid layer formed on the core substrate and partially covering the core substrate;

at least one resin dielectric layer formed on the solid layer and the core substrate;

a plurality of pads formed on the resin dielectric layer and exposed at the main surface of the wiring substrate, the pads including first pads located within a region above the solid layer and second pads located outside of said region; and first top-flattened solder bumps formed on the corresponding first pads and including a top face having a diameter, second top-flattened solder bumps formed on the corresponding second pads and including a top face having a diameter, the diameter of the top face of each of the first top-flattened solder bumps being substantially equal to the diameter of the top face of each of the second top-flattened solder bumps.

2. A wiring substrate as claimed in claim 1 wherein said first solder bumps are comprised of an amount of solder smaller than that of which said second solder bumps are comprised.

* * * * *